(12) United States Patent
Collins et al.

(10) Patent No.: US 11,719,729 B2
(45) Date of Patent: Aug. 8, 2023

(54) HIGH-RESOLUTION DATA COLLECTION SYSTEM WITH MULTIPLE DATA EGRESS ROUTES

(71) Applicant: Florida Power & Light Company, Juno Beach, FL (US)

(72) Inventors: Christopher S Collins, North Palm Beach, FL (US); Michael T Rothenberg, Stuart, FL (US); Adam D Meranda, Jupiter, FL (US); Bryan M Kitchener, Boynton Beach, FL (US)

(73) Assignee: FLORIDA POWER & LIGHT COMPANY, Juno Beach, FL (US)

( * ) Notice: Subject to any disclaimer, the term of this patent is extended or adjusted under 35 U.S.C. 154(b) by 300 days.

(21) Appl. No.: 17/071,561

(22) Filed: Oct. 15, 2020

(65) Prior Publication Data

US 2022/0120794 A1  Apr. 21, 2022

(51) Int. Cl.
*G01R 22/06* (2006.01)

(52) U.S. Cl.
CPC ......... *G01R 22/063* (2013.01); *G01R 22/068* (2013.01)

(58) Field of Classification Search
CPC ..... G01R 22/063; G01R 22/068; G06Q 50/00
See application file for complete search history.

(56) References Cited

U.S. PATENT DOCUMENTS

| 11,425,473 B2 * | 8/2022 | Joppich-Dohlus ... | G01R 21/007 |
| 2002/0075622 A1 * | 6/2002 | Robinson ................ | H02B 1/03 361/127 |
| 2012/0268291 A1 * | 10/2012 | Boot ........................ | H04L 1/22 340/870.03 |

(Continued)

FOREIGN PATENT DOCUMENTS

| CA | 2790309 A1 * | 8/2011 | ....... H04L 29/08846 |
| KR | 101668791 B1 * | 10/2016 | ............ G08C 17/02 |

OTHER PUBLICATIONS

Andreopoulos, et al. "Cross-Layer Optimized Video Streaming Over Wireless Multihop Mesh Networks", IEEE Journal On Selected Areas in Communications, vol. 24, No. 11, Nov. 2006.

(Continued)

*Primary Examiner* — Fekadeselassie Girma
*Assistant Examiner* — Rajsheed O Black-Childress
(74) *Attorney, Agent, or Firm* — Tarolli, Sundheim, Covell & Tummino, LLP (57) ABSTRACT

A system for monitoring power flow at a premises can include a smart meter that measures coarse power flow data for the premises. The coarse power flow data characterizes power consumption and/or power generation. The system can also include a power data recorder having a first transceiver that communicates with the smart meter via a first protocol. The power data recorder can have a second transceiver that communicates with a node on a data mesh network via a second protocol. The smart meter transmits the coarse power flow data to a node on a meter mesh network in response to polling for the coarse power flow data, and the smart meter transmits the coarse power flow data to the power data recorder via the first protocol in response to detecting a fault condition or after a time interval has expired. The power data recorder encapsulates the coarse power flow data.

21 Claims, 4 Drawing Sheets

(56) References Cited

U.S. PATENT DOCUMENTS

2014/0028468 A1\* 1/2014 Grady .................. G08C 15/00
340/870.03
2020/0182918 A1\* 6/2020 Trieste, Jr. ........... G01N 33/004

OTHER PUBLICATIONS

Chapman, "Planning of Integrated Smart Grid Wreless Networks".
Seattle City Light, Construction Standard, "AMI Collector Antennas" Dec. 7, 2017.
Santika, et al. "Building an Overlay for Wireless Mesh Network", IEEE Conference Publication, Proceedings of the 2011 International Conference on Electrical Engineering and Informatics, Jul. 17-19, 2011, DOI: 10.1109/ICEEI.2011.6021812.
Rehmani, et al. "Software Defined Networks based Smart Grid Communication: A Comprehensive Survey", arXiv:1801.04613v4 [cs.NI] Mar. 27, 2019.
Ramirez, et al. "Routing in Neighborhood Area Networks: A survey in the context of AMI communications", Journal of Network and Computer Applications vol. 55, Sep. 2015, pp. 68-80.
Le, et al,. "Advanced Metering Infrastructure Based on Smart Meters in Smart Grid", Submitted: Sep. 18, 2015 Reviewed: Apr. 12, 2016 Published: Jun. 29, 2016, DOI: 10.5772/63631.
Leon, "Smart Planning for Smart. Grid AMI Mesh Networks", Technology White Paper, May 2011.
Sensus, the Measure of the Future, "Automatic Metering Infrastructure and Radio Frequencies".

\* cited by examiner

HIGH-RESOLUTION DATA COLLECTION SYSTEM WITH MULTIPLE DATA EGRESS ROUTES

TECHNICAL FIELD

The present disclosure relates to systems and methods for transmitting power flow data characterizing power consumption and/or power generation of a premises.

BACKGROUND

A mesh network (or simply meshnet) is a local network topology in which the infrastructure nodes (e.g., bridges, switches, and other infrastructure devices) connect directly, dynamically and non-hierarchically to as many other nodes as possible and cooperate with one another to efficiently route data from/to clients. This lack of dependency on one node allows for every node to participate in the relay of information. Mesh networks dynamically self-organize and self-configure, which can reduce installation overhead. The ability to self-configure enables dynamic distribution of workloads, particularly in the event a few nodes should fail. This in turn contributes to fault-tolerance and reduced maintenance costs.

Mesh networks can relay messages using either a flooding technique or a routing technique. With routing, the message is propagated along a path by hopping from node to node until the message reaches its destination. To ensure that all paths are available, the mesh network allows for continuous connections that are reconfigured around broken paths, using self-healing algorithms such as Shortest Path Bridging. Self-healing allows a routing-based network to operate when a node breaks down or when a connection becomes unreliable.

SUMMARY

One example relates to a system for monitoring power flow at a premises. The system can include a smart meter that measures coarse power flow data for the premises. The coarse power flow data characterizes power consumption by the premises and/or power generation at the premises over an interval of time. The system can also include a power data recorder having a first transceiver that communicates with the smart meter via a first protocol. The power data recorder can have a second transceiver that communicates with a node on a data mesh network via a second protocol. The smart meter transmits the coarse power flow data to a node on a meter mesh network in response to polling for the coarse power flow data, and the smart meter transmits the coarse power flow data to the power data recorder via the first protocol in response to detecting a fault condition or after a time interval has expired. The power data recorder encapsulates the coarse power flow data into a format employable by the data mesh network and transmits the encapsulated coarse power flow data to the node on the data mesh network via the second protocol.

Another example relates to a system for monitoring power flow at a plurality of premises. The system can include a meter mesh network that has a plurality of smart meters that each measure coarse power flow data for a respective premises of the plurality of premises. The coarse power flow data characterizes power consumption by the respective premises and/or power generation at the respective premises over an interval of time. The system can also include a plurality of power data recorders. Each power data recorder records granular power flow data for a respective premises of the plurality of premises, and each power data recorder corresponds to a smart meter of the plurality of smart meters. Each power data recorder can include a first transceiver that communicates with the corresponding smart meter via a first protocol and a second transceiver that communicates with a node of a plurality of nodes on a data mesh network via a second protocol. Each smart meter transmits the coarse power flow to another node on a meter mesh network in response to polling for the coarse power flow data, and each smart meter transmits the coarse power flow data to the corresponding power data recorder via the first protocol in response to detecting a fault condition or expiration of a time interval. Each power data recorder encapsulates the coarse power flow data received from a corresponding smart meter into a format employable by the data mesh network and transmits the encapsulated coarse power flow data to a corresponding node of the plurality of nodes on the data mesh network via the second protocol.

Yet another example relates to a method for monitoring power flow by a premises. The method can include measuring, by a smart meter that communicates on a meter mesh network, coarse power flow data for a premises that characterizes power consumption by the premises and/or power generation at the premises over an interval of time. The method can also include detecting, by the smart meter, a fault condition for the meter mesh network or expiration of a time interval and transmitting, by the smart meter, the coarse power flow data for the premises to a power data recorder installed at the premises. The method can further include receiving, by a first transceiver of the power data recorder, the coarse power flow data and transmitting, by as second transceiver of the power data recorder, the power flow data encapsulated for transmission on a data mesh network.

DETAILED DESCRIPTION

This disclosure relates to systems and methods for monitoring power flow at a plurality of premises (e.g., utility customer premises). The system includes a meter mesh network comprising a plurality of smart meters that wirelessly communicate with each other. Each smart meter is installed at one of the premises and is configured to measure coarse power flow data for the premises. The coarse power flow data characterizes power consumption by the premises and/or power generation (e.g., by a solar panel or a wind turbine) at the premises over an interval of time.

The system also includes a plurality of power data recorders. Each power data recorder is also installed at one of the plurality of premises, such that each power data recorder corresponds to a particular smart meter. Each power data recorder records granular power flow data for the premises. The granular power flow data can represent multiple readings of power flow over an interval of time. As an example, the coarse power flow data can represent a single reading of power use by a premises over a time interval of about 10 minutes, and the granular power reading can represent a power readings every 10-100 milliseconds over the interval of time to characterize how power changes over the interval of time. Each power data recorder can include a first transceiver that communicates with the corresponding smart meter via a first protocol and a second transceiver that communicates with a node of a plurality of nodes on a data mesh network via a second protocol.

Each smart meter transmits the coarse power flow to another node on a meter mesh network in response to polling for the coarse power flow data. This power flow data can be relayed to a utility server that communicates with nodes on the meter mesh network. Each smart meter can also be configured to transmit the coarse power flow data to the corresponding power data recorder via the first protocol in response to detecting a fault condition that indicates an error on the meter mesh network or after expiration of a time interval (e.g., one hour) since the coarse power flow data was transmitted to the corresponding power data recorder.

Each power data recorder encapsulates the coarse power flow data received from the corresponding smart meter into a format employable by the data mesh network and transmits the encapsulated coarse power flow data to a corresponding node of the plurality of nodes on the data mesh network via the second protocol. The encapsulated coarse power flow data can be relayed to the utility server through the data mesh network.

By implementing the smart meters and the power data recorders to operate in concert, each smart meter is provided with two routes of egress to provide the utility server with the coarse power flow data, namely, a first route through the meter mesh network, and a second route to the corresponding power data recorder and to the data mesh network.

Figure 1:
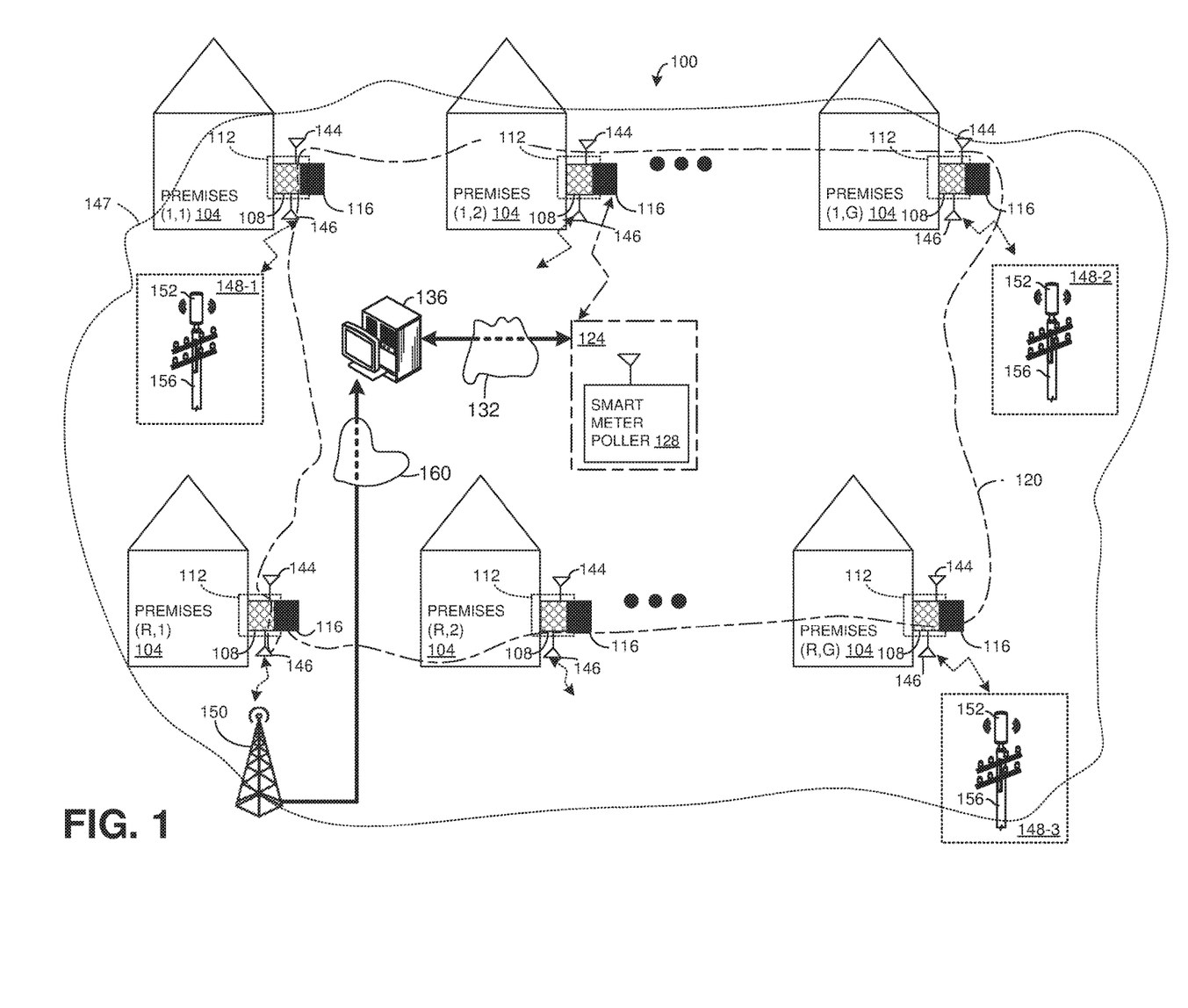
FIG. 1 illustrates an example of a system that provides multiple routes of egress for power flow data measured by smart meters installed at multiple premises.

FIG. 1 illustrates an example of a system 100 for monitoring power flow at a plurality of premises 104. Each of the premises 104 can be implemented as customer premises for a utility company, such as a power distribution system. The premises 104 can be implemented as residential domiciles (e.g., houses), commercial facilities or a combination thereof.

In the example illustrated, the premises 104 are organized as strings of premises 104. In FIG. 1, there are R number of strings, and each string has G number of premises 104, where R is an integer greater than or equal to one, and G is an integer greater than or equal to three. Thus, each premises 104 is labeled with an index number, i,j, where i is a string number and j is a node number with the corresponding string. Thus, the second premises 104 in the first string is labeled as premises (1,2) 104. Similarly, the last (Gth) premises 104 in the last (Rth) string is labeled as premises (R,G) 104 In the example illustrated, each of the R number of strings can have the same or different number of premises 104. It is noted that the topology is selected for simplification of explanation, and in other examples, the premises 104 can be arranged in a manner that is more or less organized from that shown and described.

Each of the premises 104 can have a power data recorder 108 installed. Each power data recorder 108 can be configured to record power flow by the corresponding premises 104 at a high rate (e.g., every 10-1000 milliseconds). The power data recorder 108 can be installed, for example in a power collar 112 (e.g., that includes a surge shield) that includes a receptacle for a smart meter 116. In such a situation, the power collar 112 can be installed in a meter box, and the power collar 112 can operate as a passive device that is powered through inductive coupling. Each power collar 112, each power data recorder 108 and each smart meter 116 can be uniquely identified by the index number of the corresponding premises 104.

Each smart meter 116 and each power data recorder 108 can operate as a computing platform. That is, each smart meter 116 and each power data recorder 108 can include a non-transitory memory that stores machine executable instructions and a processor for accessing the non-transitory memory and executing the machine executable instructions. Moreover, in some examples, each smart meter 116 and/or each power data recorder 108 can include a controller with machine readable instructions embedded in an integrated non-transitory memory.

Each smart meter 116 can wirelessly communicate on a meter mesh network 120. The meter mesh network 120 can be a mesh network. In some examples, communications on the meter mesh network 120 can employ the Internet Protocol version 6 (IPv6) protocol or the Internet Protocol version 4 (IPv4) protocol to communicate (e.g., for network addressing). Each smart meter 116 can measure coarse power flow data characterizing power employed by a respective premises 104 and/or power generated at the premises 104 (e.g., by a solar panel and/or a wind turbine). One or more of the smart meters 116 can communicate on a smart meter egress port 124. In the present example, the second smart meter 116 of the first string, namely smart meter (1,2) 116, can communicate with the egress port 124. In other examples, additional or alternative smart meters 116 can communicate with the egress port 124.

The smart meter egress port 124 can be implemented with a smart meter poller 128 with an attached antenna. In such a situation, periodically, and/or asynchronously, the smart meter poller 128 can poll the smart meter (1,2) 116 for coarse power flow data measured by each of the smart meters 116 or some subset thereof. Each of the polled smart meters 116 can send coarse power flow data to the smart meter (1,2) 116 via the meter mesh network 120. As noted, the meter mesh network 120 is a mesh network. Thus, coarse power flow data can be transmitted to the smart meter (1,2) 116 via one or more hops. For instance, in response to a polling, the smart meter 116 at premises (1,1) 104, namely, smart meter (1,2) 116 can send coarse power flow data to the smart meter (1,2) 116 via the meter mesh network 120, and the smart meter (1,2) 116 can provide the coarse power flow data measured by the smart meter (1,1) 116 to the smart meter poller 128.

The smart meter egress port 124 can be coupled to a utility network 132 that can be implemented as a proprietary network. A utility server 136 receives and processes the coarse power flow data from the polled smart meters 116. As is illustrated, the meter mesh network 120 can have a single point of failure. That is, if the smart meter 116 connected to the smart meter egress port 124, namely, the smart meter (1,2) 116 goes offline (e.g., is damaged, loses power or is otherwise not able to communicate on the meter mesh network 120), there may be no other way to collect coarse power flow data from the remaining smart meters 116. Additionally, due to the number of hops, the meter mesh network 120 is relatively slow. Thus, in many examples, the coarse power flow data can only be collected from the smart meters 116 over a relatively long interval of time (e.g., every ten minutes).

The power data recorders 108 installed at the premises 104 overcome many of the limitations of the meter mesh network 120. Each power data recorder 108 can include a first transceiver 144 (represented as an antenna) to wirelessly communicate with the smart meter 116 of the same premises 104. In some examples, each power data recorder 108 can communicate with a corresponding smart meter 116 with a first wireless network protocol, such as a Wi-Fi, Bluetooth or another low-power wireless network protocol. Additionally, in some examples, each of the power data recorders 108 can employ the IPv6 protocol or the IPv4 protocol (e.g., for network addressing) to communicate with the corresponding smart meter 116.

Each power data recorder 108 can include a second transceiver 146 (represented as an antenna) for communicating with nodes on a data mesh network 147, which can be implemented as a high-speed mesh network for transmitting data. Each power data recorder 108 can communicate with a corresponding data port 148 (e.g., a high-speed data port) or a network connection port 150. Each data port 148 can provide a point of egress for the data mesh network 147. In FIG. 1, there are three data ports 148, namely, a first data port 148-1, a second data port 148-2 and a third data port 148-3. In other examples, there could be more or less data ports 148. In some examples, the data ports 148 can wirelessly communicate via the data mesh network 147. In other examples, the data ports 148 can communicate via a wired network, such as a wide area network (WAN).

Each data port 148 can include a transceiver 152. In the example illustrated, each transceiver 152 is affixed to a utility pole 156. In other examples, the transceiver 152 can be attached to another fixture, such as a light pole. Each transceiver 152 can communicate on a wireless network protocol, such as a wireless protocol conforming to the Long Term Evolution (LTE) protocol and/or a wireless protocol conforming to the fifth generation (5G) wireless standard. In some examples, the data mesh network 147 can employ the IPv4 protocol or the IPv6 protocol (e.g., for network addressing). Additionally, each data port 148 can communicate with a network connection port 150. The network connection port 150 can be implemented, for example, as a high power transceiver, such as a cell tower. The transceiver 152 of each data port 148 and the network connection port 150 are configured to communicate on the same protocol as the second transceiver 146 of the power data recorders 108.

Each data port 148 can relay information to other data ports 148 or to the network connection port 150. The network connection port 150 can operate as a backhaul for the data mesh network 147 that can communicate with the utility server 136 via a public network (e.g., the Internet). In this manner, the utility server 136 can communicate with the power data recorders 108 via the public network 160, the network connection port 150 and/or the data ports 148. For example, the utility server 136 can be configured to query the network connection port 150 for coarse power flow data at the premises 104. In response, the network connection port 150 can query each data port 148, which in turn can poll the power data recorders 108 in range for coarse power flow data. Additionally, the network connection port 150 can poll each power data recorder 108 within range for coarse power flow data. Upon collecting the coarse power flow data, the poled power data recorders 108 can provide the data port 148 or the network connection port 150 that executed the poling with the collected coarse power flow data. The collected coarse power flow data can be passed to the utility server 136 for further processing.

As one example, consider a situation where the first data port 148-1 is queried for granular power flow data. In such a situation, the power data recorder 108 installed at the premises (1,1) 104, namely the power data recorder (1,1) 108 can be polled by the first data port 148-1 for granular power flow data. In response, the power data recorder (1,1) 108 can collect recorded granular power flow data from each corresponding premises 104. For instance, the power data recorder (1,1) 108 can collect recorded granular power flow data for the premises (1,1) 104. In response to collecting the recorded granular power flow data, the power data recorder (1,1) 108 can provide the collected granular power flow data to the data port 148-1. Similarly, the power data recorder (1,2) 108 can collect and provide recorded granular power flow data for the premises (1,2) 104.

As another example, consider a situation where the network connection port 150 is in communication with the power data recorder 108 at the premises (R,1) 104, namely, the power data recorders (R,1) and R(2,1) 108. In such a situation, the network connection port 150 can poll the power data recorders (R,1) and (R,2) 108 for granular power flow data of the premises (R,1) and (R,2) 104. In response to the poll, the power data recorders (R,1) and (R,2) 108 can collect and provide granular power flow data for the premises (R,1) and (R,2) 104 to the network connection port 150.

The data mesh network 147 is configured such that each power data recorder 108 has at least one egress route to the data ports 148 and/or the network connection port 150, and some power data recorders 108 can have multiple egress routes to the data ports 148 and/or the network connection port 150. For instance, in the example illustrated, it is presumed that the power data recorder (R,2) 108 can communicate with either the network connection port 150 or the third data port 148-3. In such a situation, the power data recorder (R,2) 108 can be polled by one or both of the network connection port 150 and the data port 148-3.

Additionally, the power flow recorders and the data mesh network 147 provide a second route of egress for each of the smart meters 116, in the meter mesh network 120. As noted, the meter mesh network 120 relies on data hops to the smart meter (1,2) 116 in the examples illustrated. In a situation where either the smart meter (1,2) 116 goes offline (e.g., due to a power outage) or another smart meter 116 logically positioned between the smart meter (1,2) 116 and the other smart meter 116, some or all of the smart meters 116 may not be able to provide coarse power flow data to the smart meter egress port 124, such that the utility server 136 may not receive coarse power flow data for the associated premises 104.

Each smart meter 116 in the meter mesh network 120 is configured to transmit coarse power flow data to the corresponding power data recorder 108 through the first transceiver 144 of the corresponding power data recorder 108 if a fault condition is detected and/or after expiration of a time interval (e.g., one hour) for transmission of the coarse power flow data to the corresponding power data recorder 108. For instance, each smart meter 116 can be configured to transmit coarse power flow data to the corresponding power data recorder 108 (or another power data recorder 108) if the respective smart meter 116 has not been polled for coarse power flow data within an interval of time (e.g., 20 minutes to one hour). Additionally or alternatively, each smart meter 116 can be configured to transmit coarse power flow data to the corresponding power data recorder 108 if a respective smart meter 116 does not detect other smart meters 116 and/or no detected smart meter 116 is in communication with the smart meter egress port 124. It is understood that the list of possible fault conditions is not exhaustive. In other examples, additional and/or alternative fault conditions can be present.

In any such situation, in response to receipt of the coarse power flow data from a smart meter 116, the corresponding power data recorder 108 encapsulates the coarse power flow data into a format for transmission on the data mesh network 147. More particularly, a controller (or other device) of a corresponding power data recorder 108 can receive the coarse power flow data on the first transceiver 144, convert the coarse power flow data into a format for transmission to a data port 148 or the network connection port 150 of the data mesh network 147. In some examples, such as a situation where the meter mesh network 120 employs IPv6 and the data mesh network employs IPv4, the encapsulation can include network address translation. In this manner, each power data recorder 108 can provide a second route of egress for coarse power flow data measured by the corresponding smart meter 116.

As an example of operation, if the smart meter 116 at the premises (R,G) 104, namely the smart meter (R,G) 116 is not polled within a particular interval of time (e.g., one hour) (or other fault condition is met) the smart meter (R,G) 116 can transmit coarse power flow data to the corresponding power data recorder 108 installed at the premises (R,G) 104, namely the power data recorder (R,G) 112. Alternatively, the smart meter (R,G) 116 can transmit the power flow data in response to detecting excessive network congestion on the meter mesh network 120. Additionally, the smart meter (R,G) 116 can be configured to transmit the coarse power flow data to the corresponding power data recorder 108 each time that a time interval (e.g., one hour) expires. The power data recorder (R,G) 108 can encapsulate the coarse power flow data received at the first transceiver 144 into a format consumable on the data mesh network 147. The power data recorder (R,G) 108 can transmit the encapsulated coarse power flow data to the third data port 148-3 via the second transceiver 146.

In some examples, some of the premises 104 may not have a power data recorder 108 installed thereon or the power data recorder 108 of a particular premises 104 may not be functioning properly. Accordingly, each power data recorder 108 can be configured to encapsulate coarse power flow data received at the first transceiver 144 into the format consumable on the data mesh network 147 for power flow data provided by a smart meter 116 that is not at the same premises 104. For instance, in such a situation, the power data recorder(R,G) 108 could encapsulate coarse power data wirelessly transmitted from the smart meter 116 at the premises (1,2).

In any such situation, encapsulated coarse power flow data provided from a power data recorder 108 can be provided to the utility server 136 via the network connection port 150 and (in some examples) the data ports 148. In response, the utility server 136 can un-encapsulate the coarse power flow data and process the coarse power flow data in a manner similar (or the same) as if the coarse power flow data was provided via the meter mesh network 120 and the utility network 132. Thus, the second route of egress of the smart meters 116 enabled by the data mesh network 147 and the power data recorders 108 provides an additional level of robustness to the system 100.

The second route of egress for the smart meters 116 can be employed, for example, in situations where wide area power outages have occurred (e.g., due to severe weather events, such as a hurricane). In such a situation, coarse power flow data from the smart meters 116 is leveraged to gauge a power status of geographic areas. However, due to the nature of severe weather events, individual premises 104 may not have power, while neighboring premises 104 do have power. In such a situation, if a given (individual) premises 104 does not have power, and a smart meter 116 at that given premises 104 provides the only route of egress for other smart meters 116, no coarse power flow data would be provided for the other smart meters 116, independent of a status of the other smart meters 116. Stated differently, even if the other smart meters 116 were online (e.g., powered on and operating properly), these other smart meters 116 would not be able to provide coarse power flow data via the meter mesh network 120, such that from the perspective of the utility server 136, it may appear that these other smart meters 116 were offline as well, which could be indicative of a much larger power outage than is actually occurring. In contrast, by employing the system 100, each smart meter 116 has multiple egress routes for the coarse power flow data, which may avoid this scenario.

Figure 2:
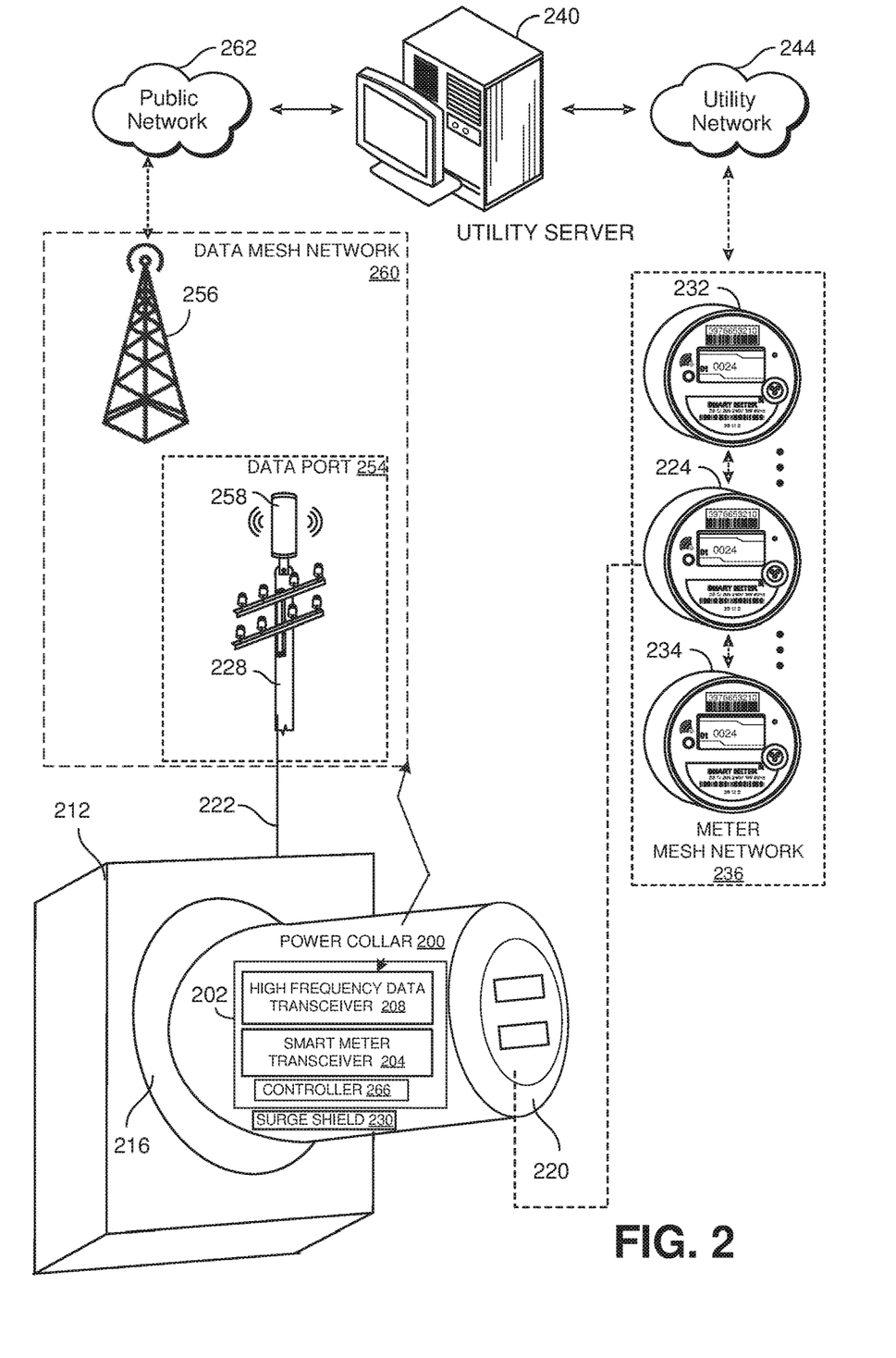
FIG. 2 illustrates an example of a system that provides multiple routes of egress for power flow data measured by a smart meter installed at a premises.

FIG. 2 illustrates an example of a power collar 200 that is employable as a power collar 112 of FIG. 1. The power collar 200 can include a power data recorder 202 that can be employed to implement the power data recorder 108 of FIG. 1. The power data recorder 202 can include a smart meter transceiver 204 that is employable to implement the first transceiver 144 of FIG. 1, and a high frequency data transceiver 208 employable to implement the second transceiver 146 of FIG. 1. The smart meter transceiver 204 can be implemented as a WiFi transceiver or a Bluetooth transceiver. The high frequency data transceiver 208 can be implemented, for example as an LTE transceiver or a 5G transceiver.

The power collar 200 can be implemented as an inductively powered device. The power collar 200 is configured for installation in a meter box 212, such as in a meter socket 216 of the meter box 212. The meter box 212 can be installed at a premises (e.g., one of the premises 104 of FIG. 1). The meter box 212 can be connected to a powerline 222 that is supplied from a utility pole 228 (or other source) to supply power to the premises. The power collar 200 can include a meter socket 220 that can receive a smart meter 224 (or a conventional meter) for measuring power consumed by the premises. The meter socket 216 can be electrically coupled to the meter socket 220. The power collar 200 can be equipped with a surge shield 230 that can detect and prevent over-current surges from penetrating the premises. The smart meter 224 can be implemented as a computing platform. For example, the smart meter 224 can include a controller implemented as a processor with machine executable instructions embedded in a non-transitory memory to control operations of the smart meter 224.

The smart meter 224 can communicate with other smart meters 232 and 234 on a meter mesh network 236. The smart meters 232 and 234 and the smart meter 224 on the meter mesh network 236 can collect coarse power flow data and provide the collected coarse power flow data to a utility server 240 via a utility network 244 (e.g., a private network). In some examples, a smart meter poller (e.g., the smart meter poller 128 of FIG. 1) can be employed to poll a given smart meter 232 on the meter mesh network 236. In response, the given smart meter 232 can poll the other smart meters, namely, the smart meters 224 and 234 for coarse power flow data. The coarse power flow data can be provided to the given smart meter 232 through a series of hops, and provided to the utility server 240 through the smart meter poller.

The power data recorder 202 can communicate with a data port 254 or a network connection port 256 (e.g., a cell phone tower, such as the network connection port 150 of FIG. 1) via the high frequency data transceiver 208. The data port 254 can include a transceiver 258 that can wirelessly communicate with the high frequency data transceiver 208 of the power data recorder 202. The data port 254 can communicate with other data ports and/or the network connection port 256 through a data mesh network 260. The network connection port 256 can collect data from the data port 254 (and other data ports on the data mesh network 260) and communicate with the utility server 240 via a public network 262 (e.g., the Internet). In some examples, the utility server 240 can query the data port 254 (relayed through the network connection port 256) for granular power flow data measured by nodes (power data recorders) of the meter mesh network 236. In response, the data port 254 can poll the power data recorder 202 for recorded granular power flow data.

The power data recorder 202 can receive the poll via the high frequency data transceiver 208. A controller 266 (or other device) of the power data recorder 202 can process the poll from the data port 254 and collect recorded granular power flow data for the associated premises. The controller 266 can cause the high frequency data transceiver 208 to transmit the recorded granular power flow data to the data port 254, which can in turn, return the recorded granular power flow data to the utility server via the network connection port 256. The controller 266 can be employed to implement a computing platform (e.g., a processor with instructions embedded in a non-transitory machine readable memory) that can control operations of the power data recorder 202.

Additionally, the power data recorder 202 and the data mesh network 260 can provide a second route of egress for the smart meter 224 coupled to the smart meter socket 220 and/or for other smart meters in the meter mesh network 236. As noted, the meter mesh network 236 relies on data hops to the smart meter 232 in the examples illustrated. In a situation where the smart meter 232 goes offline (e.g., due to a power outage), the smart meter 224 may not be able to provide coarse power flow data to the utility server 240 via the utility network 244, such that the utility server 240 may not receive coarse power flow data for the associated premises.

The smart meter 224 coupled to the smart meter socket 220 is configured to transmit coarse power flow data to the power data recorder 202 through the smart meter transceiver 204 of the power data recorder 202 if a fault condition is detected or a time interval (e.g., one hour) has expired since coarse power flow data has been transmitted to the power data recorder 202. For instance, the smart meter 224 can be configured to transmit coarse power flow data to the power data recorder 202 if the smart meter 224 has not been polled for coarse power flow data within an interval of time. Additionally or alternatively, the smart meter 224 can be configured to transmit coarse power flow data to the power data recorder 202 if the smart meter 224 does not detect other smart meters 116 and/or no detected smart meter is in communication with the smart meter egress port 124. Still further, the smart meter 224 can be configured to transmit coarse power flow data to the power data recorder 202 if the smart meter 224 detects excessive network congestion on the meter mesh network 236.

In any such situation where the conditions are met, in response to receipt of the coarse power flow data from a smart meter 224, the controller 266 of the power data recorder 202 encapsulates the coarse power flow data into a format for transmission on the data mesh network 260. More particularly, the controller 266 of the power data recorder 202 can receive the coarse power flow data on the smart meter transceiver 204, convert the coarse power flow data into a format for transmission to the data port 254 (or the network connection port 256) of the data mesh network 260.

In fact, the power data recorder 202 can be configured to encapsulate coarse power flow data received from any smart meter on the smart meter network 236, such as the smart meter 234 and/or the smart meter 232. That is, the power data recorder 202 can be configured to encapsulate the coarse flow data provided from any power meter source.

Encapsulated coarse power flow data provided from a power data recorder 202 can be provided to the utility server 240 via the data port 254 and the network connection port 256. In response, the utility server 240 can un-encapsulate the coarse power flow data and process the coarse power flow data in a manner similar (or the same) as if the coarse power flow data was provided via the meter mesh network 236 and the utility network 244. In this manner, the power data recorder 202 can provide a second route of egress for the smart meter 224 and/or other smart meters on the meter mesh network 236. Thus, the second route of egress of the smart meter 224 and/or other smart meters enabled by the data mesh network 260 and the power data recorder 202 installed on the power collar 200 provides an additional level of robustness for the transmission of coarse power flow data measured by the smart meter 224.

Figure 3:
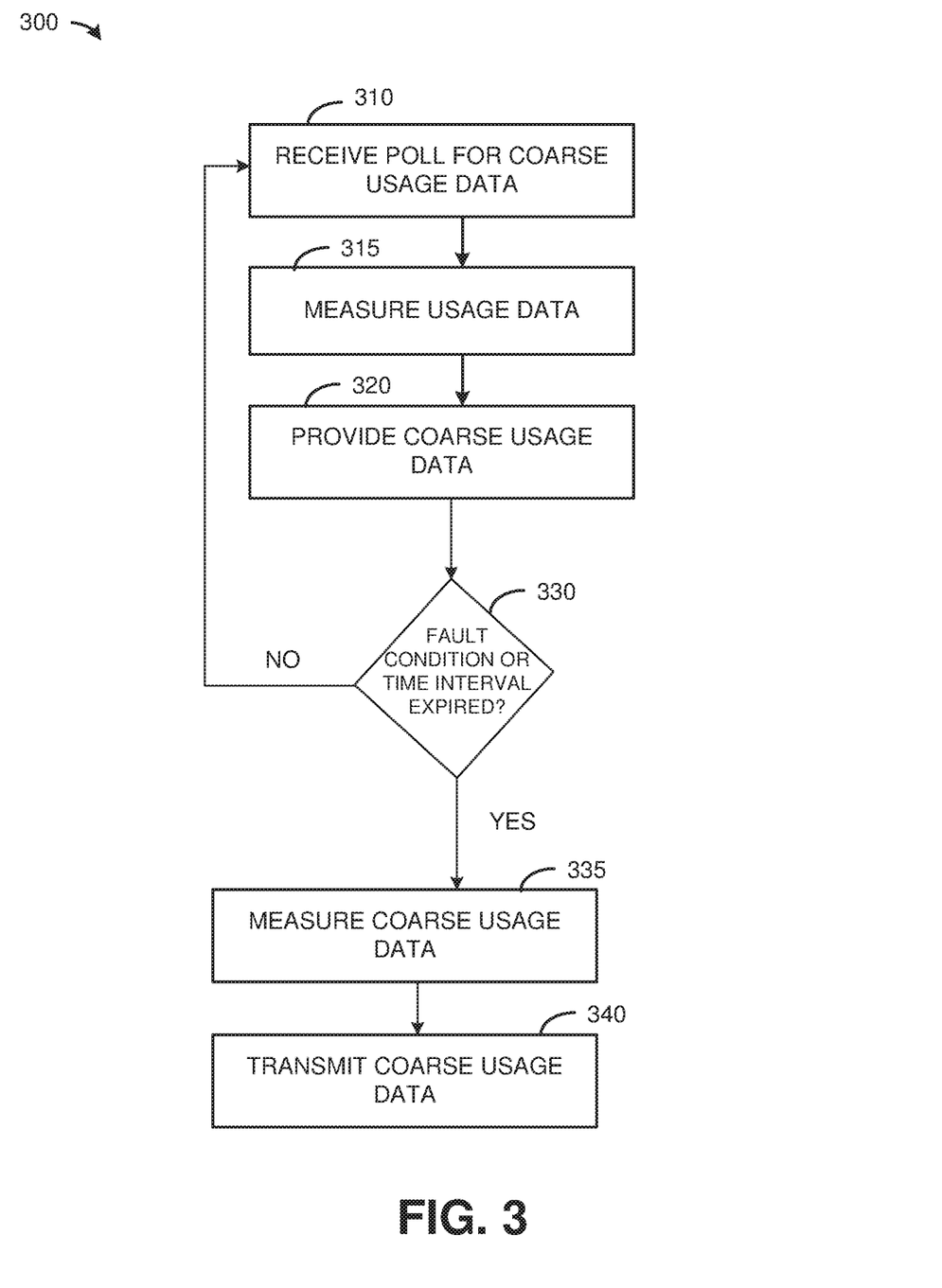
FIG. 3 illustrates a flowchart of an example method for providing coarse power flow data for a premises measured by a smart meter.
Figure 4:
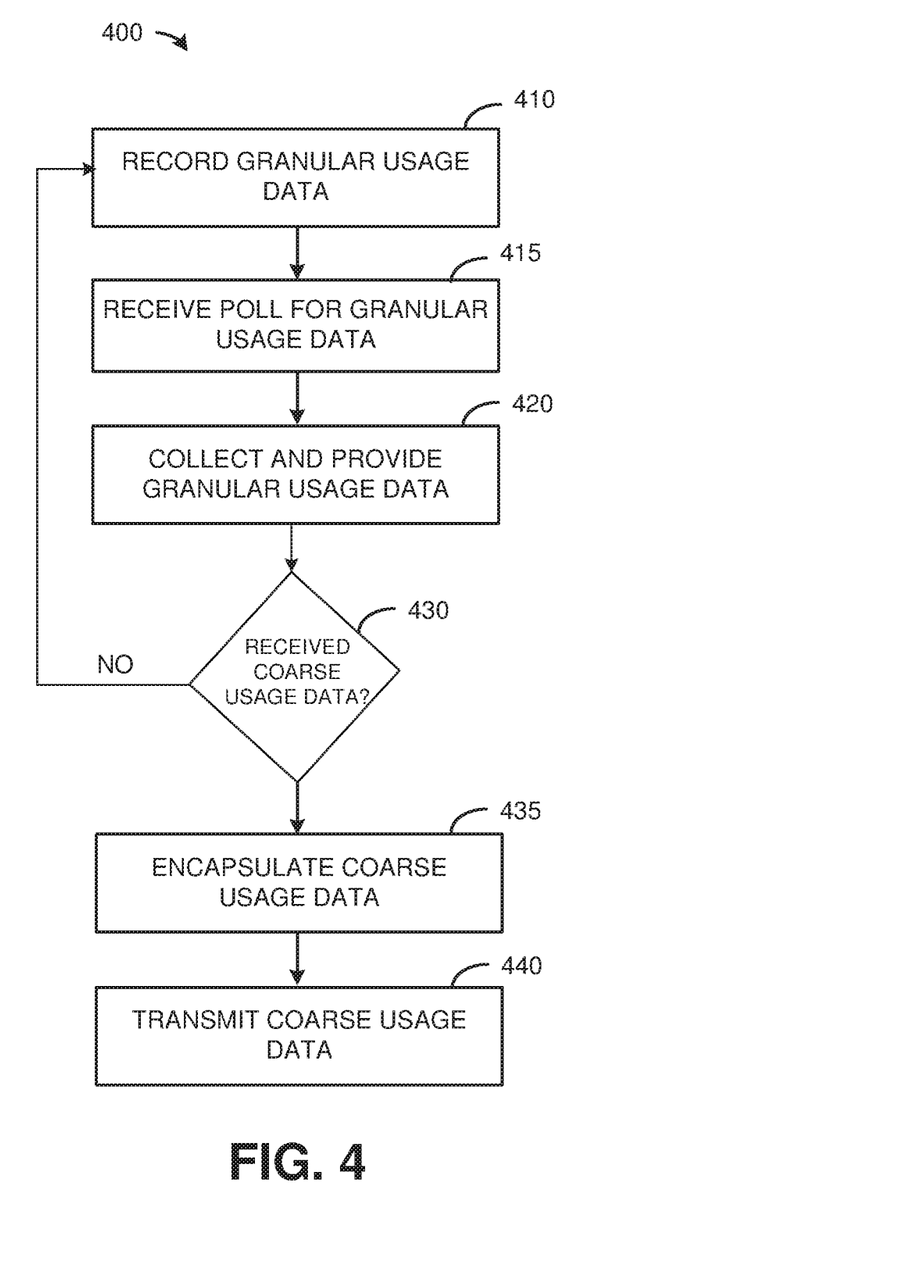
FIG. 4 illustrates a flowchart of an example method for receiving and transmitting coarse power flow data for a premises provided from a smart meter.

In view of the foregoing structural and functional features described above, an example method will be better appreciated with reference to FIGS. 3 and 4. While, for purposes of simplicity of explanation, the example methods of FIGS. 3 and 4 are shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 3 illustrates a flowchart of an example method 300 for operating a smart meter, such as the smart meter 224 of FIG. 2 and/or the smart meter 116 of FIG. 1. The smart meter can be installed to measure coarse power flow data at a premises (e.g., an instance of the premises 104 of FIG. 1). At 310, the smart meter can receive a poll transmitted from another node operating on a meter mesh network (e.g., the meter mesh network 236 of FIG. 2 or the meter mesh network 120 of FIG. 1), such as another smart meter or a smart meter poller (e.g., the smart meter poller 128 of FIG. 1) for coarse power flow data. At 315, the smart meter can measure coarse power flow data for the associated premises. At 320, the smart meter provides the requesting node with the coarse power flow data for the associated premises.

At 330, the smart meter makes a determination as to whether a fault condition has been met or a time interval (e.g., one hour) has expired since coarse power flow data was sent to a power data recorder (e.g., the power data recorder 202 of FIG. 2 and/or an instance of the power data recorder 108 of FIG. 1). The fault condition can be, for example, a determination that an interval of time has passed since a last poll for coarse usage data was received. Additionally or alternatively, the fault condition can be, for example, the smart meter not detecting other nodes on the meter mesh network. Still further, the fault condition could be a situation where excessive network congestion is detected on the meter mesh network. If the determination at 330 is negative (e.g., NO), the method 300 returns to 310. If the determination at 330 is positive (e.g., YES), the method 300 proceeds to 335.

At 335, the smart meter measures coarse usage data. At 340, the smart meter transmits the coarse usage data to the power data recorder coupled to the associated premises or to another premises.

FIG. 4 illustrates a flowchart of an example method 400 for operating a power data recorder, such as the power data recorder described in the method 300 of FIG. 3 (e.g., the power data recorder 202 of FIG. 2 and/or an instance of the power data recorder 108 of FIG. 1). For purposes of simplification of explanation, it is presumed that the method 400 executes contemporaneously with the method 300 of FIG. 3. Thus, in the method 400 of FIG. 4, it is presumed that the power data recorder and the smart meter described with respect to FIG. 3 are installed at the same premises.

At 410, the power data recorder records granular power flow data for the associated premises. At 415, the power data recorder receives a poll request from a node (e.g., the data port 254 or the network connection port 256 of FIG. 2) of a data mesh network (e.g., the data mesh network 260 of FIG. 2 and/or the data mesh network 147 of FIG. 1) for the granular power flow data. The request can be received, for example, through a high frequency data transceiver (e.g., the high frequency data transceiver 208 of FIG. 2). At 420, the power data recorder collects and provides the granular power flow data for the associated premises to the requesting node on the data mesh network via the high frequency data transceiver.

At 430, the power data recorder can make a determination as to whether coarse usage is received from the smart meter (operating the method 300 of FIG. 3) at a smart meter transceiver (e.g., the smart meter transceiver 204 of FIG. 2). If the determination at 430 is negative (e.g., NO), the method 400 can return to 410. If the determination at 440 is positive (e.g., YES), the method 400 proceeds to 435. At 440, the power data recorder transmits the encapsulated coarse power flow data to the node on the data mesh network.

At 435, the power data recorder encapsulates the coarse power flow data for the premises into a format that is employable on the data mesh network. At 440, the power data recorder transmits the encapsulated coarse power flow data to the node on the data mesh network via the high frequency data transceiver. As described, the method 300 of FIG. 3 and the method 400 of FIG. 4 operate in concert to provide two routes of egress for the described smart meter.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system for monitoring power flow at a premises, the system comprising:

a smart meter that measures coarse power flow data for the premises, wherein the coarse power flow data characterizes power consumption by the premises and/or power generation at the premises over an interval of time;

a power data recorder comprising:

a first transceiver that communicates with the smart meter via a first protocol;

a second transceiver that communicates with a node on a data mesh network via a second protocol;

wherein:

the smart meter transmits the coarse power flow data to one of another smart meter or a smart meter poller on a meter mesh network in response to polling for the coarse power flow data generated by the smart meter poller coupled to the meter mesh network, and the smart meter transmits the coarse power flow data to the power data recorder via the first protocol in response to detecting a fault condition; and the power data recorder encapsulates the coarse power flow data into a format employable by the data mesh network and transmits the encapsulated coarse power flow data to the node on the data mesh network via the second protocol, wherein the smart meter poller communicates with a utility server via a utility network and the node on the data mesh network communicates with the utility server via the Internet.

2. The system of claim 1, further comprising a power collar, wherein the power data recorder is a constituent component of the power collar, the power collar further comprising:

a meter receptacle for the smart meter; and a surge shield to prevent overcurrent to the premises, wherein the power collar is pluggable into a meter socket of a meter box.

3. The system of claim 1, wherein the power data recorder records granular power flow data for the premises, wherein the granular data power flow comprises a plurality of measurements characterizing power consumption by the premises and/or power generation at the premises over an interval of time and provides the granular power flow data via the second protocol in response to a poll from the node on the data mesh network.

4. The system of claim 3, wherein the second protocol comprises one of the Long Term Evolution (LTE) wireless protocol and the fifth generation (5G) wireless protocol.

5. The system of claim 1, wherein the fault condition comprises the smart meter not receiving a poll for the coarse power flow data over an interval of time.

6. The system of claim 1, wherein the fault condition comprises the smart meter not detecting another node on the meter mesh network.

7. The system of claim 1, wherein the fault condition comprises the smart meter detecting excessive network congestion on the meter mesh network.

8. The system of claim 1, wherein the meter mesh network employs the Internet Protocol version 6 (IPv6) protocol, and the data mesh network employs the Internet Protocol version 4 (IPv4) protocol.

9. The system of claim 1, wherein the node on the data mesh network comprises a data port that communicates with a network connection port.

10. The system of claim 9, wherein the network connection port is a cell tower.

11. A system for monitoring power flow at a plurality of premises, the system comprising:
a meter mesh network comprising:
a plurality of smart meters that each measure coarse power flow data for a respective premises of the plurality of premises, wherein the coarse power flow data characterizes power consumption by the respective premises and/or power generation at the respective premises over an interval of time;
a plurality of power data recorders, wherein each power data recorder records granular power flow data for a respective premises of the plurality of premises, and each power data recorder corresponds to a smart meter of the plurality of smart meters, each power data recorder comprising:
a first transceiver that communicates with the corresponding smart meter via a first protocol; and
a second transceiver that communicates with a node of a plurality of nodes on a data mesh network via a second protocol;
wherein:
each smart meter transmits the coarse power flow data to one of another smart meter or a smart meter poller on a meter mesh network in response to polling for the coarse power flow data generated by the smart meter poller, and each smart meter transmits the coarse power flow data to the corresponding power data recorder via the first protocol in response to detecting a fault condition; and
each power data recorder encapsulates the coarse power flow data received from a corresponding smart meter into a format employable by the data mesh network and transmits the encapsulated coarse power flow data to a corresponding node of the plurality of nodes on the data mesh network via the second protocol, wherein the smart meter poller communicates with a utility server via a utility network and the node on the data mesh network communicates with the utility server via the Internet.

12. The system of claim 11, wherein the granular power flow data recorded by each of the plurality of power data recorders comprises a plurality of measurements characterizing power flow by the respective premises over an interval of time.

13. The system of claim 11, wherein the second protocol comprises the Long Term Evolution (LTE) wireless protocol or the fifth generation (5G) wireless protocol.

14. The system of claim 11, wherein the fault condition comprises a respective smart meter not receiving a poll for the coarse power flow data over an interval of time.

15. The system of claim 11, wherein the fault condition comprises a respective smart meter not detecting another node on the meter mesh network or the respective smart meter detecting excessive network congestion on the meter mesh network.

16. The system of claim 11, wherein the meter mesh network employs the Internet Protocol version 6 (IPv6) protocol, and the data mesh network employs the Internet Protocol version 4 (IPv4) protocol.

17. The system of claim 11, wherein a plurality of nodes of the data mesh network each comprise a data port that communicates with a cell tower.

18. The system of claim 11, further comprising a utility server that receives the coarse power flow data transmitted through the meter mesh network or the data mesh network.

19. A method for monitoring power flow at a premises comprising:
measuring, by a smart meter that communicates on a meter mesh network, coarse power flow data for a premises that characterizes power consumption by the premises and/or power generation at the premises over an interval of time;
selecting, by the smart meter, a transmission destination for the coarse power flow data based on a presence or an absence of a fault condition on the meter mesh network;
transmitting, by the smart meter, the coarse power flow data for the premises to the destination in response to the selecting, wherein the destination is a smart meter poller on the meter mesh network or a power data recorder a data mesh network, wherein the smart meter poller communicates with a utility server via a utility network, and the data mesh network communicates with the utility server via the Internet;
receiving, at the utility server, the coarse power flow data through the utility network or the Internet based on the selecting.

20. The method of claim 19, wherein the fault condition detected by the smart meter comprises at least one of the smart meter not receiving a poll for the coarse power flow data over an interval of time and the smart meter not detecting another node on the meter mesh network.

21. The method of claim 19, wherein the fault condition comprises wherein the fault condition comprises the smart meter detecting excessive network congestion on the meter mesh network.

* * * * *